(12) United States Patent  
Gehring

(10) Patent No.: US 8,699,727 B2
(45) Date of Patent: Apr. 15, 2014

(54) VISUALLY-ASSISTED MIXING OF AUDIO USING A SPECTRAL ANALYZER

(75) Inventor: Steffen Gehring, Hamburg (DE)

(73) Assignee: Apple Inc., Cupertino, CA (US)

( * ) Notice: Subject to any disclaimer, the term of this patent is extended or adjusted under 35 U.S.C. 154(b) by 1105 days.

(21) Appl. No.: 12/688,717

(22) Filed: Jan. 15, 2010

(65) Prior Publication Data

US 2011/0175915 A1 Jul. 21, 2011

(51) Int. Cl.
*H04B 1/00* (2006.01)
*H03G 5/00* (2006.01)
*H03G 5/02* (2006.01)
*G10H 1/08* (2006.01)

(52) U.S. Cl.
USPC ............ 381/119; 381/103; 333/28 T; 333/18; 84/625

(58) Field of Classification Search
CPC ............................... H03G 5/025; H03G 5/165
USPC ................... 381/98, 100, 101, 102, 103, 119; 333/18, 28, 28 R, 28 T; 375/229; 708/323; 704/278; 700/94; 84/622, 84/625, 659, 660, 661; 715/716, 717
See application file for complete search history.

(56) References Cited

U.S. PATENT DOCUMENTS

| | | | |
|---|---|---|---|
| 4,464,781 A * | 8/1984 | Kaneko et al. | 381/12 |
| 5,228,093 A | 7/1993 | Agnello | |
| 6,377,915 B1 | 4/2002 | Sasaki | |
| 6,898,291 B2 | 5/2005 | Gibson | |
| 8,189,797 B1 * | 5/2012 | Ramirez | 381/56 |
| 2008/0229200 A1 | 9/2008 | Fein et al. | |
| 2009/0164034 A1 | 6/2009 | Cohen et al. | |
| 2009/0192806 A1 | 7/2009 | Truman et al. | |
| 2009/0226016 A1 | 9/2009 | Fitz et al. | |
| 2009/0281800 A1 | 11/2009 | LeBlanc et al. | |

FOREIGN PATENT DOCUMENTS

WO  WO 2006/107833 A1  10/2006

OTHER PUBLICATIONS

FabFilter Software Instruments Announce Pro-Q. FabFilter, 16 Nov. 16, 2009. <http://www.fabfilter.com/press/1258351200/fabfilter-software-instruments-announce-pro-q>.*
"Blue Cat's FreqAnalyst Multi and FreqAnalyst Pro," Blue Cat Audio, Bois Colombes, France, Mar. 5, 2007—First Version (Available at http://www.bluecataudio.com/Products/Bundle_FreqAnalystPack/, last visited Dec. 10, 2009).
"MultiInspector and MultiInspectorFree," VertexDSP, http://www.vertexdsp.com, 2007 (Available at http://www.vertexdsp.com/products_multiinspectorfree.html, last visited Dec. 10, 2009).

* cited by examiner

*Primary Examiner* — Duc Nguyen
*Assistant Examiner* — Kile Blair
(74) *Attorney, Agent, or Firm* — Fish & Richardson P.C.

(57) ABSTRACT

Processor-implemented methods and systems for visually-assisted mixing of audio using a spectral analyzer are disclosed. The system calculates and displays a spectral view for each track in an arrangement in a multi-track view. A user can then request modification of the spectral view. In response to this request for modification, the system automatically adjusts associated mixing parameters for the modified track so that the spectral output of the track substantially matches the user-requested modified spectral view. This allows a user to visually mix an arrangement by imputing a desired spectral result and having the program make the changes necessary to achieve it.

21 Claims, 8 Drawing Sheets

US 8,699,727 B2

VISUALLY-ASSISTED MIXING OF AUDIO USING A SPECTRAL ANALYZER

FIELD

The following relates to computer-assisted mixing of audio.

BACKGROUND

Mixing is the process by which a multitude of tracks in an arrangement (e.g., a musical arrangement) are combined into one or more channels, most commonly two-channel stereo. In the process, each track's parameters such as amplitude level, frequency content, dynamics and panoramic position can be manipulated. Effects such as reverb and compression can be added. The mixing process is done in order to produce an enhanced mix that is more appealing to listeners.

During the mixing process, users can adjust associated parameters for each track, and they can view a spectral view or frequency output for each of the tracks in a multi-track view. By adjusting one or more associated parameters for each track, a user can mix the arrangement. The user can visually see how each adjustment of each associated parameter affects the multi-track spectral view, but adjustment of the associate parameters can affect each spectral view in complex ways. Therefore, it can be difficult, particularly for a novice user, to find the right combination of adjustment to yield a desirable mix.

SUMMARY

Processor-implemented methods and systems for visually-assisted mixing of audio using a spectral analyzer are disclosed. The method includes calculating and displaying a spectral view for each track in an arrangement in a multi-track view. The method includes modifying the spectral view for a track in response to a user request. In response to this modified-spectral-view user request, the method includes automatically adjusting associated mixing parameters for the adjusted track so that the spectral output of the track substantially matches the modified spectral view. This allows a user to visually mix an arrangement by requesting the desired spectral result and having the program make the changes necessary to achieve it.

Many other aspects and examples will become apparent from the following disclosure.

BRIEF DESCRIPTION OF THE DRAWINGS

In order to facilitate a fuller understanding of the exemplary embodiments, reference is now made to the appended drawings. These drawings should not be construed as limiting, but are intended to be exemplary only.

DETAILED DESCRIPTION

The functions described below as being performed by various components can be performed by other components, and the various components can be combined and/or separated as desired. Other modifications also can be made.

The method for visually-assisted mixing of audio described herein can be implemented on a computer. The computer can be a data-processing system suitable for storing and/or executing program code. The computer can include at least one processor, coupled directly or indirectly to memory elements through a system bus. The memory elements can include local memory employed during actual execution of the program code, bulk storage, and cache memories that provide temporary storage of at least some program code in order to reduce the number of times code must be retrieved from bulk storage during execution. Input/output or I/O devices (including but not limited to keyboards, displays, pointing devices, etc.) can be coupled to the system either directly or through intervening I/O controllers. Network adapters may also be coupled to the system to enable the data processing system to become coupled to other data-processing systems or remote printers or storage devices through intervening private or public networks. Modems, cable modems, and Ethernet cards are just a few of the currently available types of network adapters. In one or more embodiments, the computer can be a desktop computer, laptop computer, or dedicated device.

Figure 1:
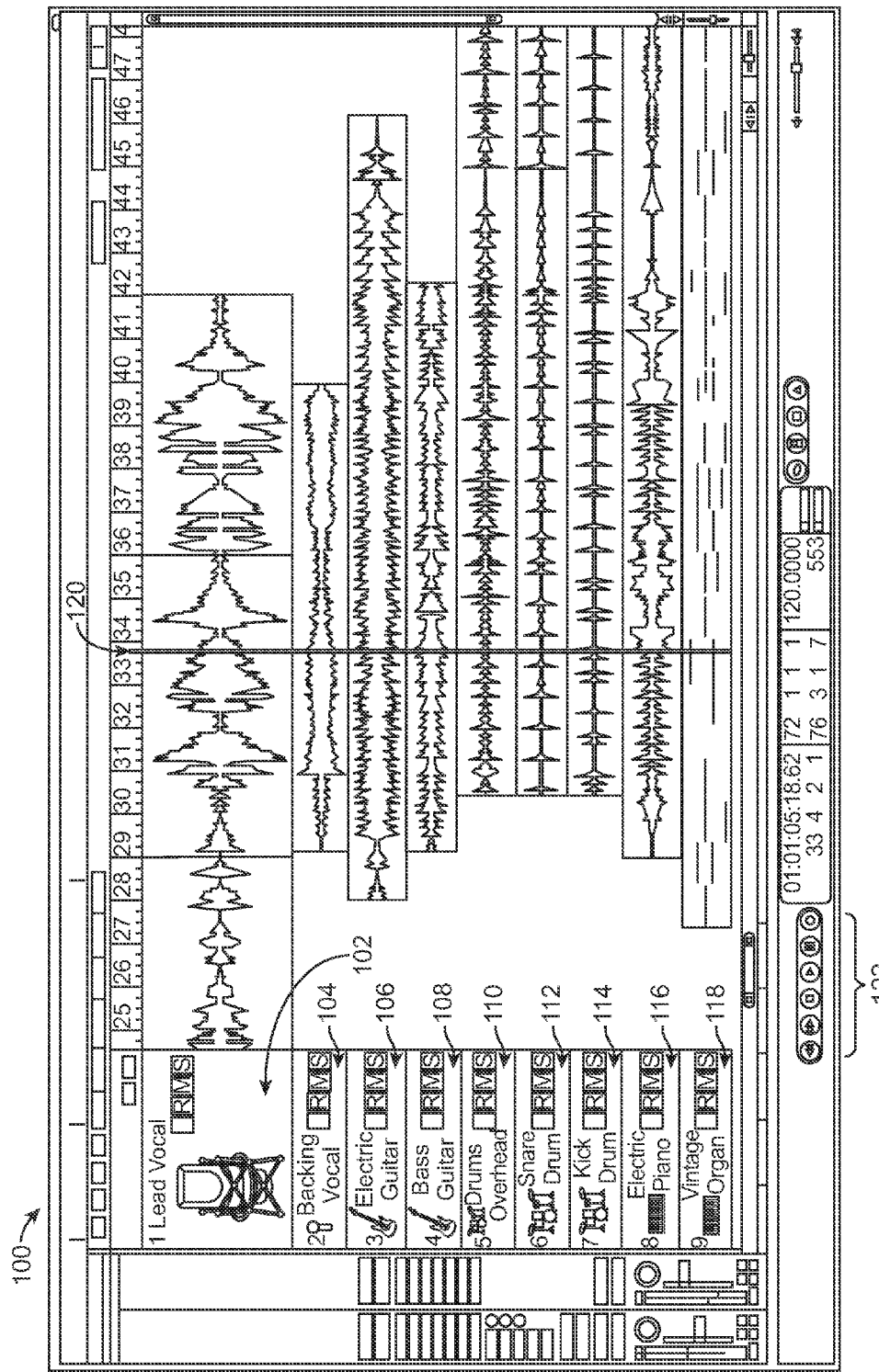
FIG. 1 illustrates a musical arrangement including MIDI and audio tracks.

FIG. 1 illustrates a musical arrangement as displayed on a digital audio workstation (DAW) including MIDI and audio tracks. The musical arrangement 100 can include one or more tracks, with each track having one or more audio files or MIDI files. Generally, each track can hold audio or MIDI files corresponding to each individual desired instrument in the arrangement. As shown, the tracks can be displayed horizontally, one above another. A playhead 120 moves from left to right as the musical arrangement is recorded or played. The playhead 120 moves along a timeline that shows the position of the playhead within the musical arrangement. The timeline indicates bars, which can be in beat increments. A transport bar 122 can be displayed and can include command buttons for playing, stopping, pausing, rewinding and fast-forwarding the displayed musical arrangement. For example, radio buttons can be used for each command. If a user were to select the play button on transport bar 122, the playhead 120 would begin to move along the timeline, e.g., in a left-to-right fashion.

FIG. 1 illustrates an arrangement including multiple audio tracks including a lead vocal track 102, backing vocal track 104, electric guitar track 106, bass guitar track 108, drum kit overhead track 110, snare track 112, kick track 114, and electric piano track 116. FIG. 1 also illustrates a MIDI vintage organ track 118, the contents of which are depicted differently because the track contains MIDI data and not audio data.

Each of the displayed audio and MIDI files in the musical arrangement, as shown in FIG. 1, can be altered using a graphical user interface. For example, a user can cut, copy, paste, or move an audio file or MIDI file on a track so that it plays at a different position in the musical arrangement. Additionally, a user can loop an audio file or MIDI file so that it can be repeated; split an audio file or MIDI file at a given position; and/or individually time-stretch an audio file.

FIGS. 2, 3, and 4A-4D are described in reference to an exemplary arrangement that includes four tracks, e.g., a kick drum track, a bass synth track, a lead synth track, and a hi-hat track.

Figure 2:
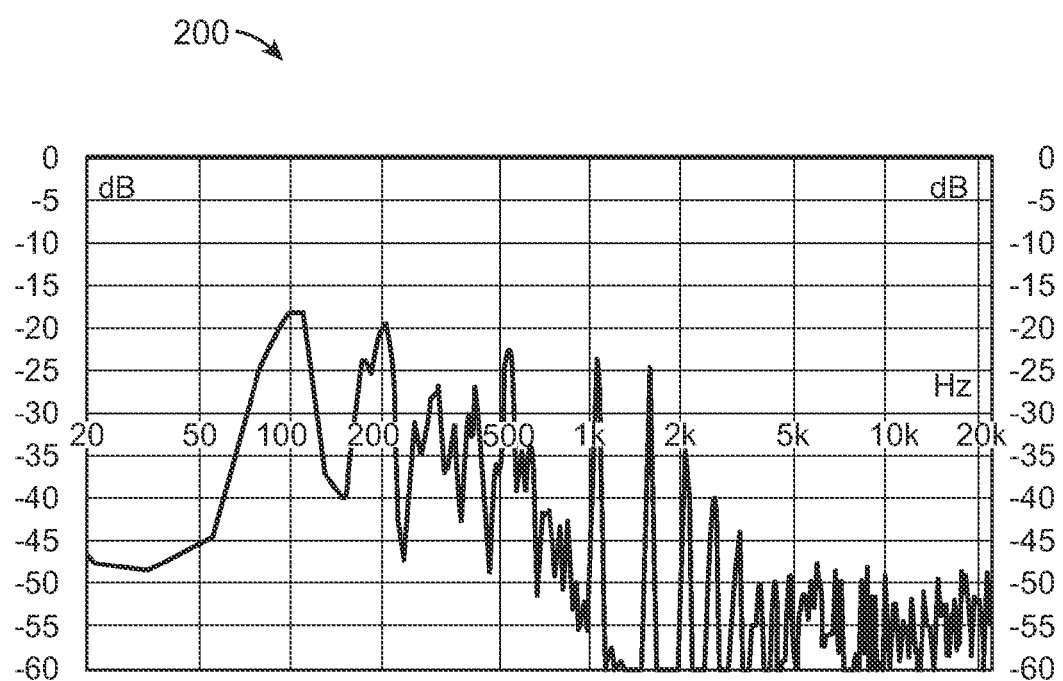
FIG. 2 illustrates a combined spectral view for a group of tracks in an arrangement.
Figure 3:
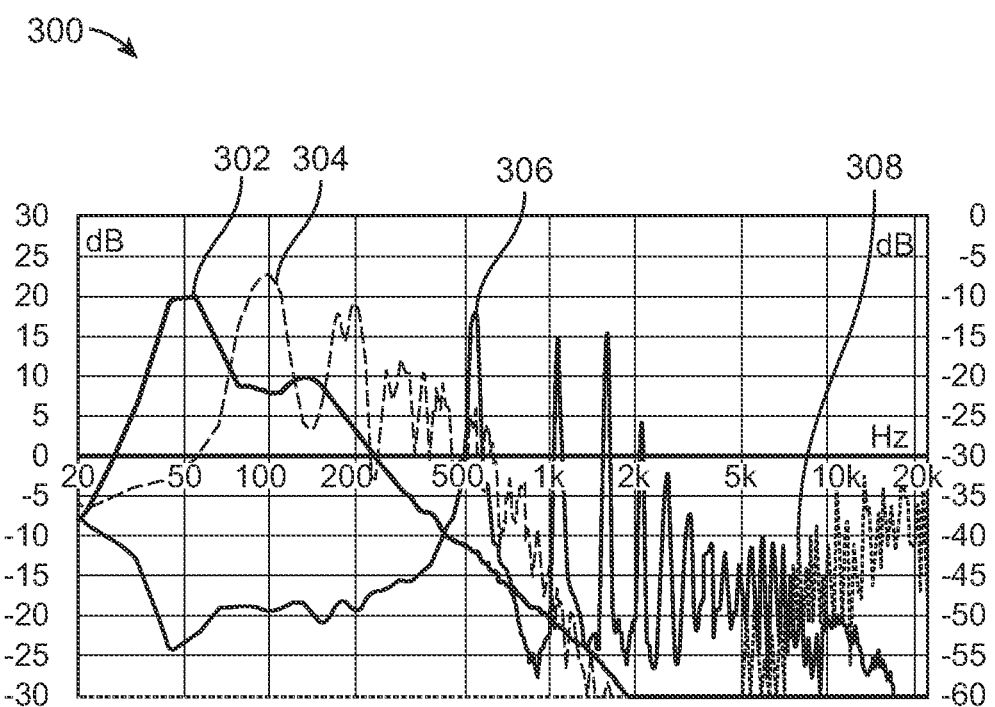
FIG. 3 illustrates separately a spectral view for each track in the arrangement of FIG. 2 in a multi-track view.

FIG. 2 illustrates a combined spectral view 200 for the group of tracks in the exemplary arrangement, which offers a general overview of the mix of the tracks. However, in this combined view, a user might find it difficult to determine how the individual tracks each contribute to the final displayed spectral view or spectrum. Therefore, in order to provide better control over the individual tracks and improve the overall audio mix, the current technology can display a separate spectral view for each track in the arrangement, but in a single view as shown in FIG. 3. The single view can be referred to as a multi-track view.

In general, a spectral view shows the frequency response for an audio stream. A spectral analyzer can output a visual frequency response (spectral view) in response to a received audio stream. The spectral view can change if the frequency content of the audio stream changes. In one example, the response time of the spectral analyzer can be set to a large time value, for example 2 seconds or more, so that the spectral view for an audio stream remains substantially constant for repetitive content.

FIG. 3 illustrates a spectral view for each track in the exemplary arrangement of FIG. 2, but in a multi-track view 300. The spectral view displays −30 to 30 dB on the y-axis and 20 Hz to 20,000 Hz on the x-axis. The ranges in this example were chosen to capture the frequencies and loudness levels of desirable sound audible to a human ear. Other ranges however can be implemented. The multi-track view of FIG. 3 includes a spectral view for the kick drum track 302, a spectral view for the bass synth track 304, a spectral view for the lead synth track 306, and a spectral view for the hi-hat track 308.

Figure 4A:
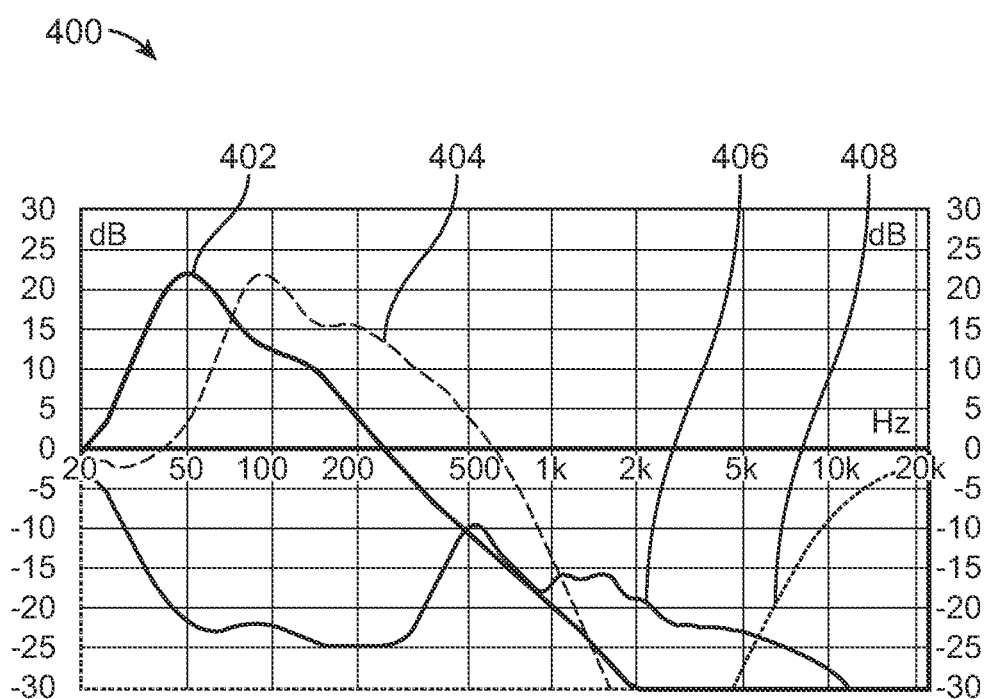
FIG. 4A illustrates separately a smoothed spectral view for each track in the arrangement of FIG. 2, but in a multi-track view.

In a preferred embodiment, as illustrated in FIG. 4A, the individual spectral views are smoothed using an enveloping technique that preserves the relevant characteristics of the spectral views. The enveloping technique can also slow the response of the spectral analyzer. This will cause the spectral view of a track to change slowly, so that a user can more easily view and request modification of an overall shape of each spectral view for mixing. A smoothed view of each of the spectral views in FIG. 3 is illustrated in FIG. 4A. More specifically, FIG. 4A illustrates smoothed envelope views 400 for the kick drum track 402, the bass synth track 404, the lead synth track 406, and the hi-hat track 408.

By visually evaluating the individual spectral views and the overall mix, a user can individually request modification of each of the various spectral views such that equalization parameters associated with each track are automatically adjusted. As a result, the overall mix is adjusted to provide a more pleasant overall mix and listening experience. For example, a user may wish to minimize overlap of spectral views for aural clarity.

More particularly, a user can request modification of a portion of a displayed spectral view by, for example, pointing, clicking, and dragging a selected portion of the spectral view with a mouse. A user can thereby request modification of a spectral view to a desired shape for mixing an overall arrangement.

Figure 4B:
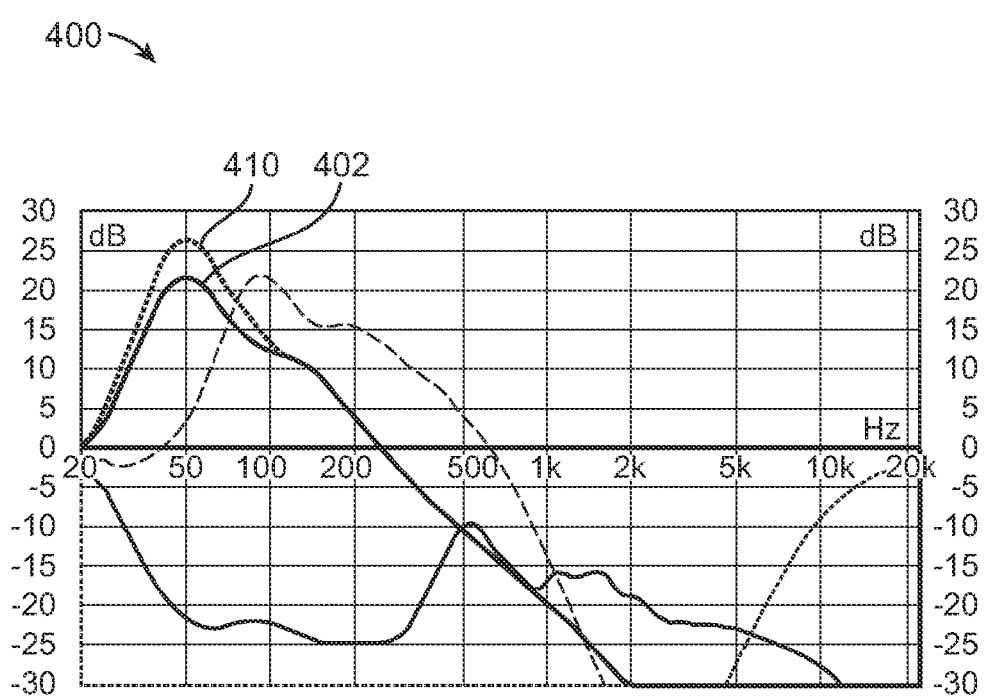
FIGS. 4B, 4C, and 4D illustrate a modified spectral view in which various associated parameters of one of the tracks has been adjusted to match a modified spectral view.

For example, FIG. 4B illustrates a smoothed spectral view for each track in the exemplary arrangement in a multi-track view in which the system has received a command or user request to modify the spectral view of a chosen track. In this example, the system has received a user request (e.g., by clicking and dragging) to increase the gain of a selected peak in the spectral view of the kick drum track, as shown by the new curve 410 which is raised above the original curve 402. The system then automatically adjusts one or more associated equalization parameters associated with the relevant tracks by activating an equalization band with a center frequency that is equivalent to the selected peak and that has appropriate bandwidth and by adjusting gain with the same amount. In one example, if there is already a band active at this frequency from a previous user action that can fulfill this task, then this active band can be reused. This will then yield a gain-modified spectral view in the multi-view user interface where the user is making the change.

Figure 4C:
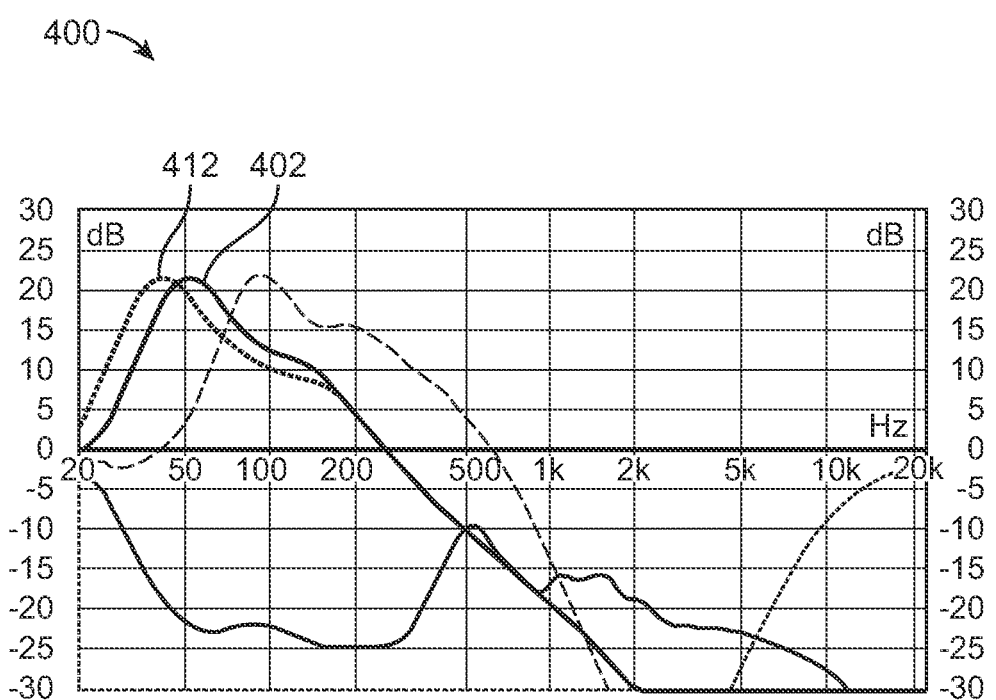

Alternatively, FIG. 4C illustrates a smoothed spectral view for each track in the exemplary arrangement in a multi-track view in which the system has received a command or user request to modify the spectral view of a chosen track (once again the kick drum track 402 in this example). In this particular example, the system has received a user input or request to decrease the center frequency of a peak in the spectral view of the kick drum track 402. A user can input this decrease-center-frequency command by clicking and dragging the selected peak in the spectral view of the track to the left as shown by the new curve 412 which is shifted to the left of the original curve 402. In one example, if a user clicks and drags the mouse left/right 20 Hz at a peak of the kick drum spectral view, then the system can activate two equalization bands, one with the same center frequency, a suiting bandwidth and a negative gain, and one with the new user-requested center frequency and an appropriate bandwidth and a positive gain, so that the resulting center peak gain can be preserved. This will then yield a shifted center frequency of the kick drum track in the user interface where the user is making the change. As is the case for modifying gain, the system can consider previously existing active equalization bands applied to the kick drum track for possible reuse when modifying the center peak frequency.

Figure 4D:
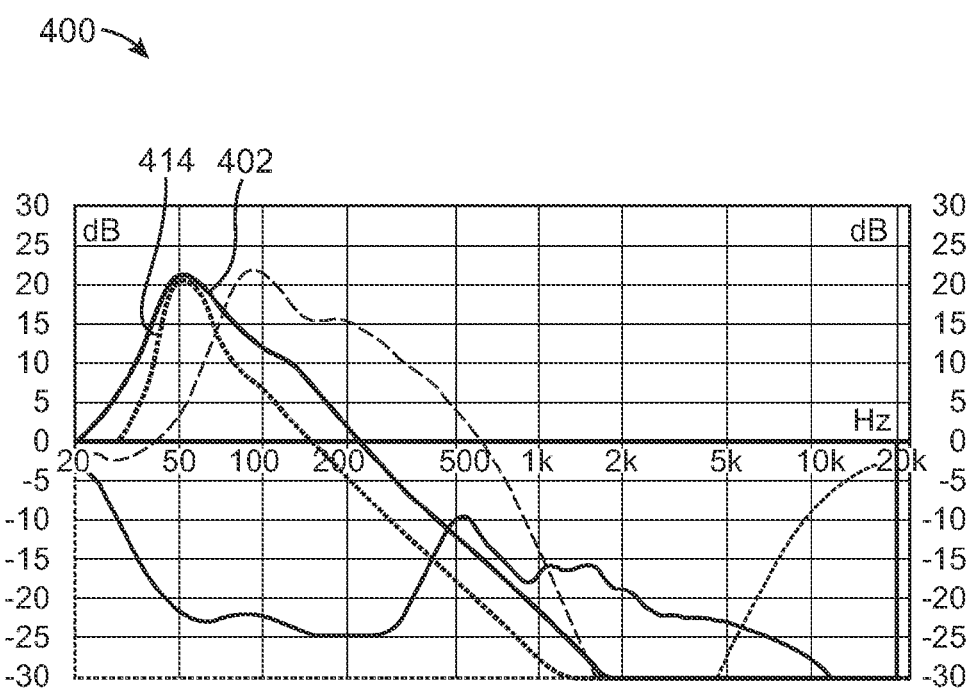

Further still, FIG. 4D illustrates a smoothed spectral view for each track in the exemplary arrangement in a multi-track view in which the system has received a command or user request to modify the spectral view of a chosen track (once again the kick drum track 402 in this example). In this particular example, the system has received a user request to decrease the q-factor of a peak in the spectral view of the kick drum track as shown by the new curve 414 which contains a lower q-factor than the original curve 402. A user can input this decrease q-factor command by option clicking and dragging the selected peak in the spectral view of the track up and down. In another example, a user can manually enter a desired q-factor value for a frequency range of a chosen spectral view. Other input gesture implementations such as right-clicking and dragging in a particular direction can activate q-factor adjustment. For example, if a user option clicks (or right clicks) and drags and adjusts a q-factor of the kick drum spectral view by −1, the system will adjust either an already-existing band with the same center frequency by changing the q-factor accordingly by −1, or it will activate a band with a suitable q-factor and a suitable gain that changes the selected portion of the spectral view accordingly. In this example an overall level adjustment might be needed. The system can activate another band with the same center frequency with a narrower (i.e., smaller) q-factor and a compensating gain.

Figure 5:
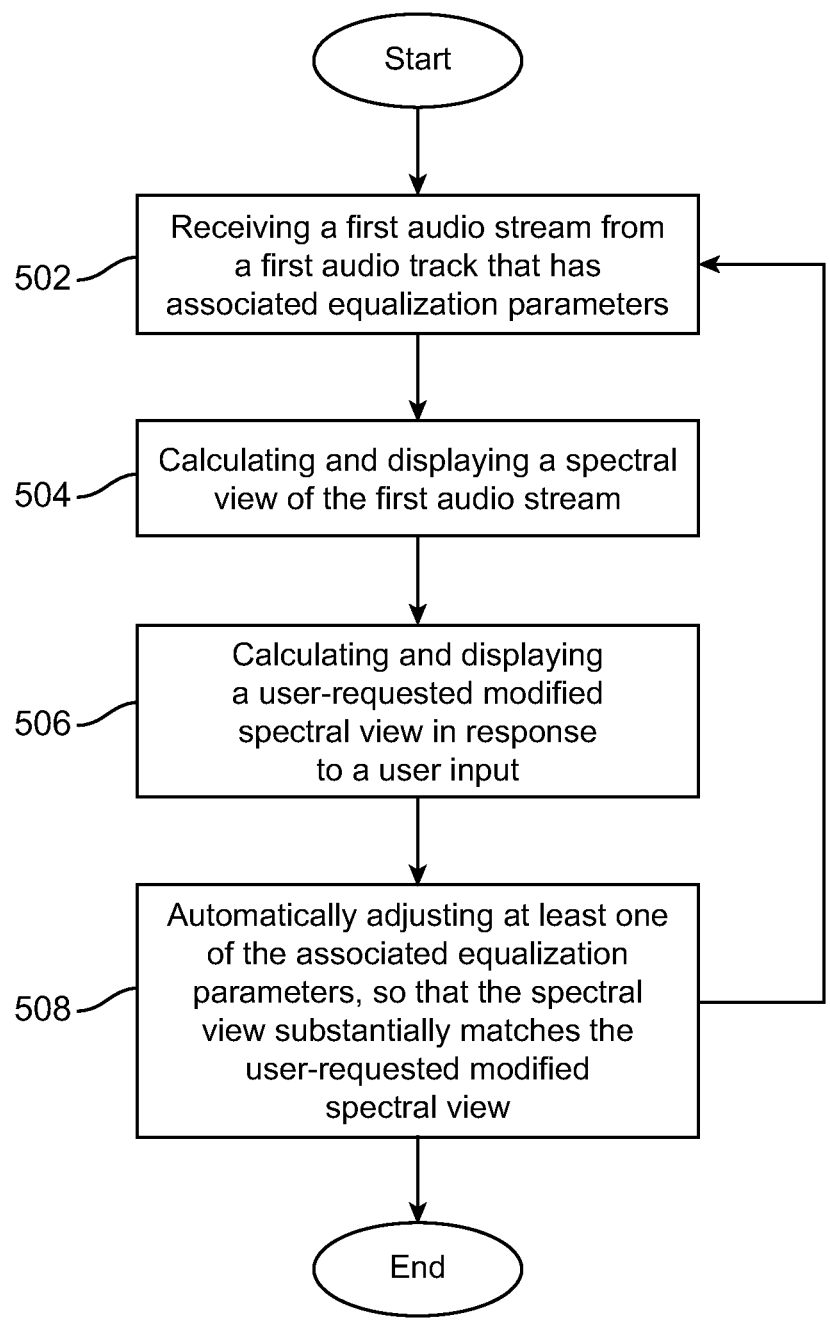
FIG. 5 is a flow chart of a method for visually-assisted mixing of audio using a spectral analyzer.

The method for visually-assisted mixing of audio using a spectral analyzer as described above may be summarized by the flow chart shown in FIG. 5. As shown in block 502, the method includes receiving a first audio stream from a first audio track that has associated equalization parameters. The method can include receiving a real-time audio stream, such as a guitar input into a DAW, or another type of live audio input into the DAW. In another example, the method can include receiving a pre-recorded audio stream stored in an audio file. The audio file can be part of a larger arrangement. In an exemplary embodiment, each track of an arrangement has associated equalization parameters. These equalization parameters can include gain, a center frequency, or a q-factor for a selected frequency range of an audio stream. In one example, the method can present a graphical user interface to allow a user to adjust equalization parameters for a given track or group of tracks in an arrangement by requesting spectral view modifications.

As shown in block 504, the method includes calculating and displaying a spectral view of a spectral output of the first audio stream. The method can also display multiple spectral views, with one for each of multiple tracks, in a single view. In this example, a second spectral view corresponding to a second audio stream is displayed, a third spectral view corresponding to a third audio stream is displayed, and so on until a spectral view is displayed for each track in an arrangement. The method can include displaying each spectral view in a different color. The method can utilize other graphical features to distinguish each spectral view in the multi-track view. The method can calculate and display the spectral views using an enveloping technique to smooth the views, and a low response time so that the spectral views remain substantially constant over time with a substantially constant audio stream.

As shown in block 506, the method includes calculating and displaying a user-requested modified spectral view of the first audio stream in response to a user input that manipulates the spectral view. For example, as shown in FIG. 4B, a user can request an increase or decrease in the gain of a peak in the spectral view of the first audio stream by clicking and dragging the peak and moving it up or down. In another example, as shown in FIG. 4C, a user can click and drag a peak in the spectral view of the first audio stream and move it left or right, thereby requesting adjustment of a center frequency for the peak. In a third example, as shown in FIG. 4D, a user can request adjustment of a q-factor for a selected frequency range in the spectral view of the first audio stream by selecting a range for the q-factor and adjusting the q-factor value (e.g., by option-clicking and dragging up or down). A q-factor value can be positive or negative.

As shown in block 508, the method includes automatically adjusting at least one of the associated equalization parameters for the first audio track. The method includes adjusting the associated equalization parameters in such a way that the spectral view and user-requested modified spectral view will substantially match each other. If the first audio stream were to be received again and redisplayed in a spectral view, the spectral view would substantially match the user-requested modified spectral view at a given point in time. This method allows a user to graphically mix an arrangement in a DAW by graphically requesting modification of a spectral view for an audio stream.

Automatically adjusting the associated equalization parameters can include increasing the gain of a peak by activating an equalization band with a center frequency equal to the peak and increasing the gain of the equalization band. Automatically adjusting the associated equalization parameters can include decreasing the gain of a peak by activating an equalization band with a center frequency equal to the peak and decreasing the gain of the equalization band. As described above, a user can select a peak (or other portion) of a spectral view of a track and click and drag it up to request an increase gain, or click and drag it down to request a decrease in gain.

Automatically adjusting an associated equalization parameter can include adjusting the center frequency of a peak by activating an equalization band with the center frequency and a negative gain and activating an equalization band with a new center frequency and a positive gain. As described above, a user can select a peak (or other portion) of the spectral view of a track and click and drag it left to request adjustment of the center frequency of a peak to a lower frequency. Similarly, a user can select a peak (or other portion) of a spectral view and click and drag it right to request increase of the center frequency for the peak.

Automatically adjusting at least one of the associated equalization parameters can include adjusting a q-factor by activating a suitable equalization band with a center frequency and adjusting a q-factor value by 1. A user can request adjustment of a q-factor by adjusting a q-value for a selected frequency range within a spectral view. Automatically adjusting an equalization parameter can also include adjusting a q-factor by activating a suitable equalization band with a corresponding q-value and gain, thereby changing the q-factor.

The method can also include suggesting to the user certain associated equalization parameter adjustments based on the currently resulting spectral view in the mix manager.

The method allows a user to request adjustment of resulting displayed spectral views for chosen tracks in an arrangement, and this in turn affects associated equalization parameters for each of the chosen tracks to achieve the desired spectral view. The system can adjust equalization parameters iteratively (i.e., by repeating a series of steps to achieve a desired result). As an audio source may change its characteristics over time, the system can approximate adjustments to associated equalization parameters. In this example, a user can visually mix audio streams in real-time. This approximation can be more accurate for audio sources with relatively steady characteristics over time.

In another embodiment, the method and system can identify mix problems by analyzing the spectral views of multiple tracks in an arrangement. The system can identify mix problems such as excessive spectral overlapping between tracks, unwanted steady resonances, and "unmusical" overall spectral characteristics of the arrangement and mix.

If the system detects excessive spectral overlapping between a first track and a second track, because the system detects that the resulting spectral views have a very high intersectional area, then the system can adjust the associated parameter for each track so that the spectral views of each track overlap by a suitable amount. The associated parameters for a track can be inaccessible to a user, also known as faceless channel parameters. In other examples the associated parameters for a track can be accessible to a user through a displayed graphical user interface.

If the system detects unwanted steady resonances, the system can adjust equalization parameters for a track by activating a band with a negative gain and suitable q-factor so that the unwanted steady resonances are removed.

In one example, a user can implement a percentage of a suggested equalization parameter. For example, a user can choose a state somewhere between an arrangement's original mix (0% of the parameter-change suggestion) and the full proposal (100% of the parameter-change suggestion).

In another example, the system only displays a spectral view for selected tracks in an arrangement. Various user interfaces can allow a user to select which tracks are to contribute their audio stream to a multi-track spectral view. In one example, each track contains a check box. Only tracks with this check box selected contribute their audio stream to the multi-track spectral view for mixing. Other graphical user interfaces can be used to allow a user to select certain tracks for this purpose as well.

The technology can take the form of an entirely hardware embodiment, an entirely software-based embodiment, or an embodiment containing both hardware and software elements. In one embodiment, the invention can be implemented in software, which includes but may not be limited to firmware, resident software, microcode, etc. Furthermore, the invention can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium (though propagation mediums in and of themselves as signal carriers may not be included in the definition of physical computer-readable medium). Examples of a physical computer-readable medium include a semiconductor or solid state memory, magnetic tape, a removable computer diskette, a random access memory (RAM), a read-only memory (ROM), a rigid magnetic disk, and an optical disk. Current examples of optical disks include compact disk read only memory (CD-ROM), compact disk read/write (CD-R/W), and DVD. Both processors and program code for implementing each as aspects of the technology can be centralized and/or distributed as known to those skilled in the art.

The above disclosure provides examples within the scope of claims, appended hereto or later added in accordance with applicable law. However, these examples are not limiting as to how any disclosed embodiments may be implemented, as those of ordinary skill can apply these disclosures to particular situations in a variety of ways.

We claim:

1. A method for visually-assisted mixing of audio using a spectral analyzer, the method comprising, in a processor:
   receiving a first audio stream from a first audio track that has associated equalization parameters and a second audio stream from a second audio track that has associated equalization parameters;
   calculating and displaying a first spectral view of the first audio stream and a second spectral view of the second audio stream, wherein the first spectral view and the second spectral view are displayed in one view;
   receiving a user input for modifying the first spectral view;
   calculating and displaying a user-requested modified spectral view of the first audio stream in response to the user input; and
   automatically adjusting at least one of the associated equalization parameters for the first audio track such that the first spectral view and user-requested modified spectral view will substantially match, if the first audio stream were to be re-calculated and displayed again.

2. The method of claim 1, wherein the first spectral view of the first audio stream and the second spectral view of the second audio stream are displayed in different colors.

3. The method of claim 2, wherein each spectral view is smoothed by enveloping and each spectral view remains substantially constant.

4. The method of claim 1, wherein automatically adjusting at least one of the associated equalization parameters includes increasing gain of a peak in the first spectral view, the method comprising:
   receiving the user input for modifying the first spectral view, wherein the user input includes:
      selecting a portion of the first spectral view associated with the peak, and
      dragging the selected portion up to request an increase in gain; and
   in response to the user input, activating an equalization band with a center frequency equal to the peak and increasing the gain of the equalization band.

5. The method of claim 1, wherein automatically adjusting at least one of the associated equalization parameters includes adjusting center frequency of a peak in the first spectral view, the method comprising:
   receiving the user input for modifying the first spectral view, wherein the user input includes:
      selecting a portion of the first spectral view associated with the peak, and
      dragging the selected portion in a horizontal direction to request a new center frequency of the peak; and
   in response to the user input:
      activating an equalization band with the center frequency that is same as the center frequency of the peak and a negative gain, and
      activating an equalization band with the user-requested new center frequency and a positive gain.

6. The method of claim 1, wherein automatically adjusting at least one of the associated equalization parameters includes adjusting a q-factor, the method comprising:
   receiving the user input for modifying a q-factor of a peak in the first spectral view, wherein the user input includes:
      selecting the peak in the first spectral view, and
      dragging the peak in a vertical direction to request a new q-factor of the peak; and
   in response to the user input, activating a suitable equalization band with a q-value and gain that corresponds to the user-requested new q-factor.

7. The method of claim 1, further comprising:
   detecting overlap of the first spectral view of the first audio stream and the second spectral view of the second audio stream that exceeds a predetermined threshold;
   suggesting a modification to the first or second spectral view so that the overlap no longer exceeds the threshold; and
   automatically adjusting at least one of the associated equalization parameters for the first or the second audio track so that the modification is implemented.

8. A system for visually-assisted mixing of audio using a spectral analyzer comprising:
   a processor coupled to a display and an input device, the processor adapted to:
      receive a first audio stream from a first audio track that has associated equalization parameters and a second audio stream from a second audio track that has associated equalization parameters;
      calculate and display a first spectral view of the first audio stream and a second spectral view of the second audio stream, wherein the first spectral view and the second spectral view are displayed in one view;
      receive a user input for modifying the first spectral view;
      calculate and display a user-requested modified spectral view of the first audio stream in response to the user input, thereby creating a user-requested modified spectral view; and automatically adjust at least one of the associated equalization parameters for the first audio track such that the first spectral view and the user-requested modified spectral view substantially match, if the first audio stream were to be re-calculated and displayed again.

9. The system of claim 8, wherein the processor is adapted to display the first spectral view of the first audio stream and the second spectral view of the second audio stream in different colors.

10. The system of claim 9, wherein the processor is adapted such that each spectral view is smoothed by enveloping and each spectral view remains substantially constant.

11. The system of claim 8, wherein automatically adjusting at least one of the associated equalization parameters includes increasing a gain of a peak in the first spectral view, and wherein the processor is adapted to:
   receive the user input for modifying the first spectral view, wherein the user input includes:
      selecting a portion of the first spectral view associated with the peak, and
      dragging the selected portion up to request an increase in gain; and
   in response to the user input, activate an equalization band with a center frequency equal to the peak and an increased gain.

12. The system of claim 8, wherein automatically adjusting at least one of the associated equalization parameters includes adjusting a center frequency of a peak in the first spectral view, and wherein the processor is adapted to:
   receive the user input for modifying the first spectral view, wherein the user input includes:
      selecting a portion of the first spectral view associated with the peak, and
      dragging the selected portion in a horizontal direction to request a new center frequency of the peak; and
   in response to the user input:
      activate an equalization band with a center frequency that is same as the center frequency of the peak and a negative gain, and
      activate an equalization band with the user-requested new center frequency and a positive gain.

13. The system of claim 8, wherein automatically adjusting at least one of the associated equalization parameters includes adjusting a q-factor, and wherein the processor is adapted to:
   receive the user input for modifying a q-factor of a peak in the first spectral view, wherein the user input includes:
      selecting the peak in the first spectral view, and
      dragging the peak in a vertical direction to request a new q-factor of the peak; and
   in response to the user input, activate a suitable equalization band with a q-value and gain that corresponds to the user-requested new q-factor.

14. The system of claim 8, wherein the processor is adapted to:
   detect overlap of the first spectral view of the first audio stream and the second spectral view of the second audio stream that exceeds a predetermined threshold;
   suggest a modification to the first or second spectral view so that the overlap no longer exceeds the threshold; and
   automatically adjust at least one of the associated equalization parameters for the first or the second audio track so that the modification is implemented.

15. A computer program product for visually-assisted mixing of audio using a spectral analyzer, the computer program product implemented in a non-transitory computer-readable medium and including instructions for execution by a processing module that is operative to:
   receive a first audio stream from a first audio track that has associated equalization parameters and a second audio stream from a second audio track that has associated equalization parameters;
   calculate and display a first spectral view of the first audio stream and a second spectral view of the second audio stream, wherein the first spectral view and the second spectral view are displayed in one view;
   receive a user input for modifying the first spectral view;
   calculate and display a user-requested modified spectral view of the first audio stream in response to the user input, thereby creating a user-requested modified spectral view; and
   automatically adjust at least one of the associated equalization parameters for the first audio track such that the first spectral view and the user-requested modified spectral view substantially match, if the first audio stream were to be re-calculated and displayed again.

16. The computer program product of claim 15, wherein the processing module is operative to display the first spectral view of the first audio stream and the second spectral view of the second audio stream in different colors.

17. The computer program product of claim 16, wherein each spectral view is smoothed by enveloping and each spectral view remains substantially constant.

18. The computer program product of claim 15, wherein automatically adjust at least one of the associated equalization parameters increasing a gain of a peak in the first spectral view, and wherein the processing module operative to:
   receive the user input for modifying the first spectral view, wherein the user input includes:
      selecting a portion of the first spectral view associated with the peak, and
      dragging the selected portion up to request an increase in gain; and
   in response to the user input, activate an equalization band with a center frequency equal to the peak and an increased gain.

19. The computer program product of claim 15, wherein automatically adjusting at least one of the associated equalization parameters includes adjusting a center frequency of a peak in the first spectral view, and wherein the processing module is operative to:
   receive the user input for modifying the first spectral view, wherein the user input includes:
      selecting a portion of the first spectral view associated with the peak, and
      dragging the selected portion in a horizontal direction to request a new center frequency of the peak; and
   in response to the user input:
      activate an equalization band with a center frequency that is same as the center frequency of the peak and a negative gain, and
      activate an equalization band with the user-requested new center frequency and a positive gain.

20. The computer program product of claim 15, wherein automatically adjust at least one of the associated equalization parameters includes adjusting a q-factor, and wherein the processing module is adapted to:
   receive the user input for modifying a q-factor of a peak in the first spectral view, wherein the user input includes:
      selecting the peak in the first spectral view, and
      dragging the peak in a vertical direction to request a new q-factor of the peak; and
   in response to the user input, activate a suitable equalization band with a q-value and gain that corresponds to the user-requested new q-factor.

21. The computer program product of claim 15, wherein the processing module is operative to:
- detect overlap of the first spectral view of the first audio stream and the second spectral view of the second audio stream that exceeds a predetermined threshold;
- suggest a modification to the first or second spectral view so that the overlap no longer exceeds the threshold; and
- automatically adjust at least one of the associated equalization parameters for the first or the second audio track so that the modification is implemented.

* * * * *

UNITED STATES PATENT AND TRADEMARK OFFICE
CERTIFICATE OF CORRECTION

PATENT NO. : 8,699,727 B2  
APPLICATION NO. : 12/688717  
DATED : April 15, 2014  
INVENTOR(S) : Steffen Gehring Page 1 of 1

It is certified that error appears in the above-identified patent and that said Letters Patent is hereby corrected as shown below:

In the Claims:

In claim 18, column 10, line 27, delete "adjust" and insert -- adjusting --, therefor.

In claim 20, column 10, line 57, delete "adjust" and insert -- adjusting --, therefor.

Signed and Sealed this
Twenty-second Day of July, 2014

Michelle K. Lee
*Deputy Director of the United States Patent and Trademark Office*